United States Patent [19]

Feuerbaum

[11] Patent Number: 4,651,003

[45] Date of Patent: Mar. 17, 1987

[54] PARTICLE-ACCELERATING ELECTRODE

[75] Inventor: Hans-Peter Feuerbaum, Munich, Fed. Rep. of Germany

[73] Assignee: Siemens Aktiengesellschaft, Berlin and Munich, Fed. Rep. of Germany

[21] Appl. No.: 697,047

[22] Filed: Jan. 31, 1985

[30] Foreign Application Priority Data

Feb. 27, 1984 [DE] Fed. Rep. of Germany ....... 3407050

[51] Int. Cl.$^4$ .......................... G21K 1/08; H01J 3/14; H01J 3/26
[52] U.S. Cl. .............................. 250/396 R; 313/363.1
[58] Field of Search ........................ 250/396 R, 441.1; 313/361.1, 363.1

[56] References Cited

U.S. PATENT DOCUMENTS

| 2,266,218 | 12/1941 | Krause | 250/441.1 |
| 2,292,087 | 8/1942 | Ramo | 250/441.1 |
| 4,169,229 | 9/1979 | Feuerbaum | 250/396 |
| 4,413,181 | 11/1983 | Feuerbaum | 250/310 |
| 4,467,205 | 8/1984 | Beisswenger et al. | 250/396 R |
| 4,508,967 | 4/1985 | Boissel et al. | 250/396 R |

FOREIGN PATENT DOCUMENTS 3204897  8/1983  Fed. Rep. of Germany .

Primary Examiner—Bruce C. Anderson
Attorney, Agent, or Firm—Hill, Van Santen, Steadman & Simpson

[57] ABSTRACT

A particle-accelerating electrode designed as a Faraday cage and having positioned therein a blanking system for blanking a particle beam. With the electrode disclosed, the problem of providing a vacuum seal in a particle-optical column is solved in simple fashion without the particle-optical column having to be lengthened. A structure for vacuum sealing is provided in a beam path of the electrode as part of the particle-accelerating electrode.

14 Claims, 2 Drawing Figures

PARTICLE-ACCELERATING ELECTRODE

BACKGROUND OF THE INVENTION

The invention relates to a particle-accelerating electrode designed as a Faraday cage structure and inside of which a blanking system is provided for blanking a particle beam.

It is standard in electron beam measuring technology to register high-frequency events at a measuring location with the assistance of stroboscopic measuring methods. Given a stroboscopic measuring method, an electron beam or, in more general terms a particle beam, is gated synchronously with the high-frequency event at a measuring location such that the particle beam senses the measuring location and thus triggers measured signals only during a fraction or during a plurality of fractions of a period duration of the high-frequency event at the measuring location. This occurs during each and every period of the high-frequency event at the measuring location. Stroboscopic measuring methods are preferably executed in scanning electron microscopes. Since the particle beam must be keyed in and blanked out given stroboscopic measuring methods, a particle beam blanking system is required in a stroboscopic measuring apparatus. Such a particle beam blanking system is usually provided as part of a beam generating system.

A blanking system for a particle beam is known from U.S. Letters Pat. No. 4,169,229, incorporated herein by reference, wherein the particle beam is shaped after its emission with the assistance of a Wehnelt electrode and then passes an accelerating electrode designed as an apertured disk. After passage through this accelerating electrode, the particle beam impinges a first pin diaphragm, passes through the actual deflection system which comprises two symmetrical deflector plates, passes through a further pin diaphragm, and finally enters a vacuum tube through a third apertured disk secured to the vacuum tube. Since this known apparatus for blanking a particle beam is extended in the direction of the particle beam, the incorporation of such a blanking system in a particle beam apparatus requires a lengthening of the particle-optical column by introducing an additional ring into the particle-optical column. Such an apparatus, moreover, is difficult to manipulate, since many different piece parts must themselves be respectively dismantled when replacing such an arrangement or when merely removing such an arrangement from the particle-optical column. As a consequence of the many different piece parts, involved adjustment systems are required, these making the overall apparatus relatively expensive. The overall arrangement, moreover, requires many individual pin diaphragms or apertured disks in order, on the one hand, to meet particle-optical requirements and, on the other hand, in order to enable a good vacuum seal. Given this known apparatus, the entire blanking system is accommodated in a vacuum-tight housing together with the beam generator.

A particle beam generating system is known from German patent application No. P 32 04 897.1, incorporated herein by reference, which comprises a particle-accelerating electrode designed as a Faraday cage and in whose interior a blanking system is attached for blanking a particle beam. This known particle beam generating system is designed such that it permits an optimum beam value or brightness and an optimum centering for a specific accelerating voltage. Since the patent application states nothing with respect to a required vacuum seal of the particle beam generating system, it is assumed that this particle-accelerating electrode is also integrated into the particle-optical beam path together with the blanking system in a fashion that is standard according to the prior art. Since, due to the blanking system, the particle-emitting electrode has a considerable extent in the direction of the particle beam, the particle-optical column must be lengthened in comparison to a particle beam system without the blanking system. This usually occurs by means of an additional introduction of a ring into the particle-optical column. As in the aforementioned apparatus, moreover, additional apertured disks or pin diaphragms are required for the vacuum seal, these resulting in a considerable expenditure for additional adjustment systems.

SUMMARY OF THE INVENTION

An object of the present invention is to specify a particle-accelerating electrode of the type initially cited which solves the problem of the vacuum seal in a simple way, wherein the particle-optical column need not be lengthened, is easy to manipulate, and can be relatively inexpensively manufactured.

This object is achieved by providing a particle-accelerating electrode according to the invention wherein at least one sealing means for vacuum sealing is provided in a beam path as a part of the particle-accelerating electrode.

A particle-accelerating electrode of the invention permits a simple adjustment of this electrode in the particle beam optical beam path. A connection piece of a particle-accelerating electrode of the invention can be designed such that it can be fitted in vacuum-tight fashion into an opening of a vacuum wall as a flange. When this opening in the vacuum wall is disposed in defined fashion with respect to the particle-optical axis, then this particle-accelerating electrode is also disposed in defined fashion relative to the particle-optical axis via a defined arrangement of the connecting piece at the particle-accelerating electrode.

The connecting piece of the particle-accelerating electrode can be designed such that an additional flange ring can be disposed on it, said flange ring being flexibly adaptable to various openings of vacuum walls of various commercially available particle beam devices.

As an apparatus for the vacuum seal, a pin diaphragm or an apertured disk can, in particular, be integrated into the particle-accelerating electrode. Advantageously, the bore of the particle-accelerating electrode at the particle beam input of this particle-accelerating electrode should be designed such that it permits an optimum beam and an optimum centering of the particle beam. It is beneficial for this purpose when the appliance provided for the vacuum seal is not provided until the end of this bore immediately in front of the blanking system. This appliance for the vacuum seal need not be designed as a separate part. The bore at the particle beam input of the particle-accelerating electrode can also be designed such that it is gradually or discontinuously or abruptly tapered to dimensions which are required for the vacuum seal.

An appliance for the vacuum seal can also be disposed at the particle beam output of the particle-accelerating electrode. It is fundamentally sufficient when a single appliance for the vacuum seal is integrated into the particle-accelerating electrode. This single appliance for the vacuum seal can be disposed at an arbitrary location of the particle-accelerating electrode insofar as it fulfills the purpose of the vacuum seal.

In electron beam measuring technology, an acceleration voltage of 2.5 kV is usually used in the quantitative potential measurement at LSI electronic components. Since the potential resolution is particularly favorable given a high-current source, high-current cathodes such as, for example, lanthanum hexaboride cathodes, are advantageously employed. Such high-current cathodes, however, require a particularly good vacuum in the cathode chamber because the performance capability of these high-current cathodes otherwise suffers. It is beneficial in such a case when a structure for the vacuum seal having a particularly small opening is provided at the particle beam input of the particle-accelerating electrode. In such a case, it is particularly beneficial for the vacuum seal and for the beam shaping when a further structure, for example a pin diaphragm having a small opening, is provided at the particle beam output of the particle-accelerating electrode. Since the vacuum in the particle-optical column need not be particularly good at the level of the imaging structure or deflector structure, the opening of the structure for the vacuum seal and beam shaping at the particle-beam output of the particle-accelerating electrode can be somewhat larger than the opening of the structure for the vacuum seal at the particle beam input of the particle-accelerating electrode.

Given an apparatus of the invention, the particle-accelerating electrode together with the blanking system and together with at least one structure for vacuum sealing is compactly replaceable. The invention enables a particle-optical column of a particle beam apparatus to be employed without an extension ring. The invention facilitates the adjustment of the particle-accelerating electrode. The invention solves the vacuum problem better—viewed overall—than is possible with the prior art because not as many parts have to be adjusted in the beam path, and thus tighter tolerances are possible for the applicances for the vacuum seal. When switching between various acceleration voltages, a particle-accelerating electrode of the invention can be interchanged rather comfortably for a different particle-accelerating electrode without a cathode or an anode having to be modified. The electrode is held in position by screws or in some other fashion.

DESCRIPTION OF THE PREFERRED EMBODIMENTS

Figure 1:
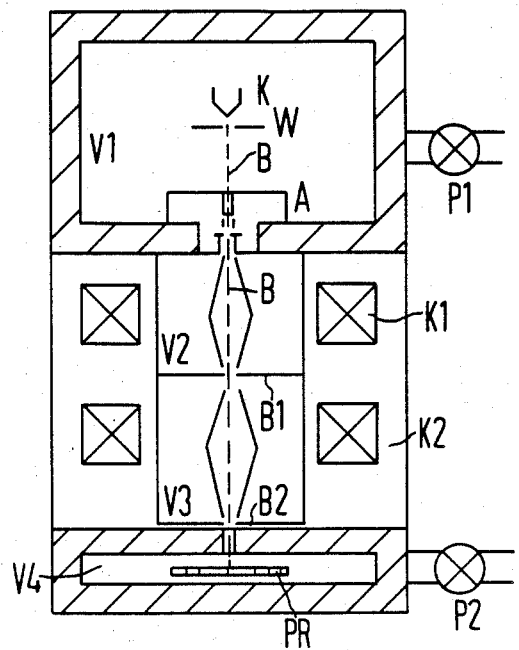
FIG. 1 schematically shows a particle beam apparatus comprising a particle-accelerating electrode of the invention.

FIG. 1 schematically shows an electron beam apparatus. In the cathode chamber, an electrode beam B is emitted by the cathode K and is shaped by a Wehnelt electrode. The electron beam B is accelerated in the direction toward an electron-beam accelerating anode A of the invention. The electron beam B first passes through a bore in the anode A which is optimally designed for an acceleration voltage of 2.5 kV. At the end of this bore, the electron beam B passes through a diaphragm which seals the vacuum V1 of the cathode chamber off from the remaining vacuums of the electron beam apparatus. The vacuum V1 of the cathode chamber is generated via a pump P1.

After passage through the first diaphragm of the anode A, the electron beam B passes two plates of a blanking system, passes through a further diaphragm, and then proceeds into the first part V2 of a vacuum tube. After passing a first sliding diaphragm B1 having an aperture dimension of less than 500 $\mu$m and preferably about 300 $\mu$m, the electron beam B passes the second portion V3 of the vacuum tube and then passes through a further sliding diaphragm B2. Finally, the electron beam B impinges on a measuring location on the specimen PR. This specimen PR is situated in a vacuum V4. This vacuum V4 is generated via a pump P2. In the vacuum tube formed of the parts V2, V3, the electron beam B is influenced by the condenser lenses K1, K2 and by further deflector means that are not shown in the drawing.

Figure 2:
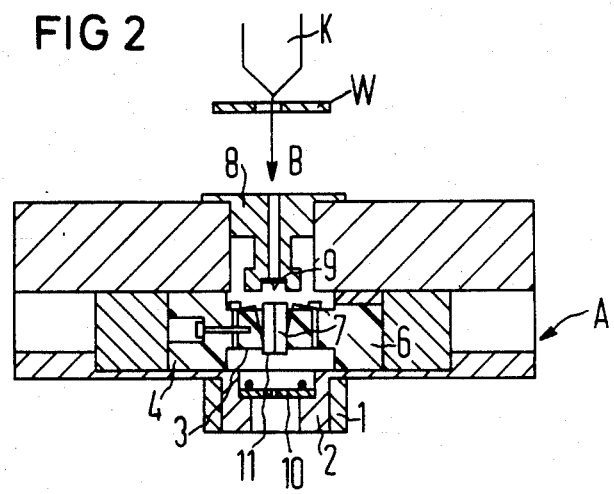
FIG. 2 schematically shows a particle-accelerating electrode of the invention.

FIG. 2 schematically shows an electron-accelerating anode A of the invention. The electron beam B emitted by the cathode K is shaped by the Wehnelt electrode W. The electron beam B then passes a first part 8 at the input of the anode A as viewed in the beam direction. This part 8 comprises a bore which provides an optimum beam value or brightness and an optimum centering. At the end of this bore of the part 8 a diaphragm 9 is positioned for the vacuum seal between the vacuum V1 of the cathode chamber and the portion V2 of the vacuum tube following thereupon. The diaphragm 9 has a diameter of 300 $\mu$m. This enables a vacuum V1 in the cathode chamber of $10^{-7}$ bar. After passage through the diaphragm 9, the electron beam B passes the two deflector plates 7, 11 of the blanking system integrated into the Faraday cage of the anode A. In order for the pulse generator which supplies the blanking pulses for the blanking system to be designed as simply as possible, the plate 7 as well as the part 8 and the diaphragm 9 advantageously lie at anode potential. In such a case, blanking pulses from a pulse generator need only be communicated to the plate 11. This plate 11 must therefore be electrically insulated from all parts that lie at anode potential. A carrier 4 to which the plate 11 is secured via a part 3 by screws is therefore advantageously designed as an insulator. An electrical line for the blanking pulses for the plate 11 can be channeled in the carrier 4 and then through a bore through a part or through a plurality of parts of the anode A.

Finally, the electron beam B impinges an output diaphragm 10 at the electron beam output of the anode A. This diaphragm 10 has a diameter of less than 2 mm and preferably from 500 $\mu$m to 1 mm. The diameter of the diaphragm 10 represents a compromise because, on the one hand, it should be as small as possible in order to permit a best possible vacuum in the portion V2 of the vacuum tube and, on the other hand, it should permit a certain divergence of the electron beam B so that the electron beam B can be shaped in a beneficial fashion by the condenser lenses K1, K2.

The anode A finally comprises a connecting piece 2 which serves for centering and adjusting the anode A in the opening of a vacuum wall and simultaneously serves for vacuum sealing. A ring 1 can be positioned on this connecting piece 2, the dimensions of this ring being capable of being flexibly adapted to various dimensions of openings in vacuum walls of various commercially available electron beam apparatus. The connecting piece 2 and the diaphragm 10 again advantageously lie at anode potential, just as do the parts of the anode A which are not referenced with numerals, these to be at least partially placed at anode potential so that a Faraday cage can be formed.

Given employment of a somewhat more expensive pulse generator, both deflector plates 7, 11 can also be controlled with blanking pulses. Methods for the control of a plate or of two mutually opposite plates for blanking a particle beam are disclosed in U.S. Pat. No. 4,413,181, incorporated herein by reference.

The vacuum in the portion V2 of the vacuum tube amounts to about $10^{-3}$ through $10^{-5}$ bar V4 amounts to $10^{-5}$ through $10^{-6}$ bar. The height of the anode A amounts to about 3 cm.

The invention enables improved particle beam properties with respect to the focussing thereof.

Although various minor changes and modifications might be proposed by those skilled in the art, it will be understood that I wish to include within the claims of the patent warranted hereon all such changes and modifications as reasonably come within my contribution to the art.

I claim as my invention:

1. A particle-accelerating anode for use in a beam generating system having a cathode which emits an electron beam towards the particle-accelerating anode and wherein the cathode is housed in a container having a vacuum, comprising:
   a Faraday cage structure having entry bore at a side facing
      the cathode, said bore being dimensioned to provide an optimized directional beam value or brightness and centering of the beam, and a blanking means for blanking the beam attached within the Faraday cage structure; and
   at least one sealing means within the Faraday cage structure and positioned in a path of the beam between the entry bore and the blanking means for vacuum sealing so as to maintain the vacuum surrounding the cathode.

2. A particle-accelerating anode according to claim 1 wherein said sealing means comprises a pin diaphragm.

3. A particle-accelerating anode according to claim 1 wherein the sealing means is provided at an end of said bore adjacent the blanking means and at an end of the bore which is opposite the end of the bore facing the cathode.

4. A particle-accelerating anode according to claim 1 wherein an aperture of the sealing meanshas a dimension of less than 500 μm.

5. A particle-accelerating anode according to claim 4 wherein an aperture of the sealing means has a dimension of approximately 300 μm.

6. A particle-accelerating anode according to claim 1 wherein said further sealing means for vacuum sealing is positioned at a beam output end of said particle-accelerating anode such that the blanking means lies between the sealing means and further sealing means.

7. A particle-accelerating anode according to claim 6 wherein said further sealing means has a diaphragm aperture of less than 2 mm.

8. A particle-accelerating anode according to claim 7 wherein said further sealing means has a diaphragm aperture of from 500 μm to 1 mm.

9. A particle-accelerating anode according to claim 1 wherein a connecting piece means for vacuum sealing and for adjustment of said particle-accelerating anode is provided at a beam output end thereof.

10. A particle-accelerating anode according to claim 9 wherein a further ring whose dimension is adaptable to various openings to vacuum walls is disposed on said connecting pieces means.

11. A particle-accelerating anode according to claim 1 wherein said blanking means comprises blanking deflection plates.

12. A beam generating system, comprising:
   a vacuum chamber housing a cathode and having an anode positioned at an exit therefrom and in a beam path of a beam generated by the cathode;
   said anode comprising a Faraday cage having an entry bore at an input and a diaphragm positioned in the beam path and in alignment with the entry bore; and
   the Faraday cage forming said anode having an exit, and between the entry bore and the exit a beam blanking means being provided within the Faraday cage.

13. A beam generating system according to claim 12 wherein a Wehnelt electrode is provide in the vacuum chamber and the diaphragm is positioned at an end of said entry bore adjacent the blanking means.

14. A beam generating system according to claim 12 wherein the blanking means comprises a delfection plates, the diaphragm is positioned at an end of the bore adjacent the blanking means, and a further diaphragm is positioned at the exit of the Faraday cage.

* * * * *